(12) United States Patent
Hoffmeyer et al.

(10) Patent No.: US 11,037,860 B2
(45) Date of Patent: Jun. 15, 2021

(54) MULTI LAYER THERMAL INTERFACE MATERIAL

(71) Applicant: INTERNATIONAL BUSINESS MACHINES CORPORATION, Armonk, NY (US)

(72) Inventors: Mark K. Hoffmeyer, Rochester, MN (US); Eric J. Campbell, Rochester, MN (US); Phillip V. Mann, Rochester, MN (US); Sarah K. Czaplewski-Campbell, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/454,370

(22) Filed: Jun. 27, 2019

(65) Prior Publication Data

US 2020/0411411 A1     Dec. 31, 2020

(51) Int. Cl.
| | |
|---|---|
| *H01L 23/433* | (2006.01) |
| *H01L 23/16* | (2006.01) |
| *H01L 23/36* | (2006.01) |
| *H01L 23/373* | (2006.01) |
| *H01L 21/52* | (2006.01) |
| *H01L 23/367* | (2006.01) |

(Continued)

(52) U.S. Cl.
CPC ............ *H01L 23/433* (2013.01); *H01L 21/52* (2013.01); *H01L 23/16* (2013.01); *H01L 23/3675* (2013.01); *H01L 24/33* (2013.01); *H05K 1/0203* (2013.01); *H05K 7/20436* (2013.01); *H01L 23/3735* (2013.01); *H01L 23/3738* (2013.01); *H01L 2023/4037* (2013.01); *H01L 2023/4068* (2013.01); *H01L 2224/33051* (2013.01); *H01L 2224/33505* (2013.01)

(58) Field of Classification Search
CPC ... H01L 23/433; H01L 23/16; H01L 23/3675; H01L 23/3735; H01L 23/3738; H01L 24/33; H01L 2023/4068; H01L 2023/4037
See application file for complete search history.

(56) References Cited

U.S. PATENT DOCUMENTS

| | | | | |
|---|---|---|---|---|
| 5,195,021 A | * | 3/1993 | Ozmat | ............... H01L 23/3735 174/252 |
| 6,245,186 B1 | | 6/2001 | Alcoe | |

(Continued)

FOREIGN PATENT DOCUMENTS

| | | |
|---|---|---|
| CN | 102956584 A | 3/2013 |
| CN | 203675528 U | 6/2014 |

(Continued)

OTHER PUBLICATIONS

Anonymous, "Method for improving TIM adhesion to the IHS surface via mechanical interlocking designs", An IP.com Prior Art Database Technical Disclosure, IP.com No. IPCOM000146345D, IP.com Electronic Publication Date: Feb. 12, 2007, 6 pages.

(Continued)

*Primary Examiner* — Ida M Soward
(74) *Attorney, Agent, or Firm* — L. Jeffrey Kelly

(57) ABSTRACT

A multi-layer thermal interface material including two or more thermal interface materials laminated together, where each of the two or more thermal interface materials comprise different mechanical properties.

21 Claims, 10 Drawing Sheets

(51) Int. Cl.
*H05K 7/20* (2006.01)
*H05K 1/02* (2006.01)
*H01L 23/00* (2006.01)
*H01L 23/40* (2006.01)

(56) References Cited

U.S. PATENT DOCUMENTS

| | | | |
|---|---|---|---|
| 6,372,997 B1 | 4/2002 | Hill | |
| 7,200,006 B2 | 4/2007 | Farrow | |
| 7,269,015 B2 | 9/2007 | Hornung | |
| 7,582,403 B2* | 9/2009 | Bailey | H05K 1/095 430/200 |
| 7,755,184 B2* | 7/2010 | Macris | H01L 23/42 257/706 |
| 7,875,972 B2* | 1/2011 | Jadhav | H01L 23/3735 257/712 |
| 8,389,119 B2* | 3/2013 | Panzer | B32B 37/02 428/408 |
| 8,693,200 B2 | 4/2014 | Colgan | |
| 8,877,318 B2 | 11/2014 | Nishikawa | |
| 9,017,808 B2 | 4/2015 | Wang | |
| 9,179,579 B2 | 11/2015 | Hada | |
| 9,472,485 B2 | 10/2016 | Saeidi | |
| 9,609,744 B2 | 3/2017 | Hoffmeyer | |
| 9,795,059 B2* | 10/2017 | Strader | H05K 7/2039 |
| 9,826,662 B2 | 11/2017 | Kim | |
| 10,182,514 B2 | 1/2019 | Hoffmeyer | |
| 10,186,477 B2* | 1/2019 | Gowda | H01L 24/24 |
| 10,566,313 B1* | 2/2020 | Li | H01L 23/10 |
| 10,781,349 B2* | 9/2020 | Zhang | H01L 23/3737 |
| 2002/0015288 A1* | 2/2002 | Dibene, II | H01R 12/7088 361/711 |
| 2002/0135984 A1* | 9/2002 | Greenwood | H01L 23/4275 361/708 |
| 2003/0160319 A1 | 8/2003 | Zheng | |
| 2004/0265489 A1* | 12/2004 | Dubin | H01L 23/433 427/212 |
| 2005/0248924 A1 | 11/2005 | Farrow | |
| 2006/0157223 A1 | 7/2006 | Gelorme | |
| 2007/0091574 A1 | 4/2007 | Jarrett | |
| 2008/0165502 A1 | 7/2008 | Furman | |
| 2008/0305321 A1* | 12/2008 | Raravikar | B82Y 30/00 428/323 |
| 2009/0122491 A1 | 5/2009 | Martin | |
| 2010/0129648 A1 | 5/2010 | Xu | |
| 2010/0187680 A1 | 7/2010 | Otsuka | |
| 2010/0328895 A1 | 12/2010 | Bhagwagar | |
| 2011/0090650 A1* | 4/2011 | Oda | H01L 23/42 361/717 |
| 2013/0160983 A1 | 6/2013 | Zhang | |
| 2013/0199752 A1 | 8/2013 | Colgan | |
| 2013/0265722 A1 | 10/2013 | Hill | |
| 2013/0308274 A1 | 11/2013 | Murdock | |
| 2013/0329352 A1 | 12/2013 | Nigen | |
| 2014/0070393 A1 | 3/2014 | Bartley | |
| 2014/0193658 A1* | 7/2014 | Ross | H01L 24/83 428/576 |
| 2014/0264799 A1 | 9/2014 | Gowda | |
| 2014/0328024 A1 | 11/2014 | Mataya | |
| 2014/0345843 A1* | 11/2014 | Kirkor | F28F 23/00 165/185 |
| 2015/0208550 A1 | 7/2015 | Rugg | |
| 2015/0305189 A1 | 10/2015 | Strader | |
| 2015/0334871 A1 | 11/2015 | Hill | |
| 2015/0352806 A1* | 12/2015 | Faotto | B32B 37/24 428/323 |
| 2016/0315030 A1 | 10/2016 | Strader | |
| 2016/0329261 A1* | 11/2016 | Hung | H01L 23/433 |
| 2017/0368795 A1* | 12/2017 | Kutsumizu | C01B 32/20 |
| 2018/0027691 A1* | 1/2018 | Czaplewski | B29C 43/18 428/213 |
| 2018/0044480 A1 | 2/2018 | Shen | |
| 2019/0267254 A1* | 8/2019 | Stathakis | H01L 21/56 |
| 2020/0058571 A1* | 2/2020 | Wang | H01L 21/4882 |
| 2020/0286806 A1* | 9/2020 | Nofen | F28F 21/085 |
| 2020/0307158 A1* | 10/2020 | Sinfield | B32B 37/0076 |
| 2020/0343427 A1* | 10/2020 | Den Breejen | H01L 33/642 |

FOREIGN PATENT DOCUMENTS

| | | |
|---|---|---|
| CN | 105611812 A | 5/2016 |
| CN | 106067452 A | 11/2016 |
| JP | 05128561 A | 5/1993 |
| TW | 200637475 A | 10/2006 |
| TW | 201425563 A | 7/2014 |
| WO | 2015120773 A1 | 8/2015 |
| WO | 2017172703 A1 | 10/2017 |
| WO | 2018002754 A1 | 1/2018 |

OTHER PUBLICATIONS

Jiang et al., "Highly Flexible and Self-Healable Thermal Interface Material Based on Boron Nitride Nanosheets and a Dual Cross-Linked Hydrogel", ACS Appl. Mater. Interfaces, Research Article, 2017 (best date available), pp. 10078-10084.

Abawi, "The Bending of Bonded Layers Due to Thermal Stress," Hughes Research Laboratories, Malibu, CA, dated Oct. 23, 2004, 11 pages.

IBM: List of IBM Patents or Patent Applications Treated as Related (Appendix P), Dec. 21, 2020, 2 pages.

International Search Report and Written Opinion, PCT/IB2017/053491, dated Jan. 4, 2018, 9 pages.

Kempers, R., and S. Kerslake. "In situ testing of metal micro-textured thermal interface materials in telecommunications applications." In Journal of Physics: Conference Series, vol. 525, No. 1, p. 012016. IOP Publishing, 2014.

Pending U.S. Appl. No. 16/847,851, filed Apr. 14, 2020, entitled: "Pierced Thermal Interface Constructions", 22 pages.

* cited by examiner

Section A-A

Section B-B

Section C-C

Section D-D

US 11,037,860 B2

MULTI LAYER THERMAL INTERFACE MATERIAL

BACKGROUND

The present invention generally relates to semiconductor packaging, and more particularly to thermal interface constructions.

Semiconductor packaging may include a thermal interface material (hereinafter "TIM") installed between a semiconductor component and a semiconductor lid, a semiconductor component and a heatsink, a semiconductor lid and a heat sink, or other uses, and is used for heat dissipation of the semiconductor components.

As performance requirements increase for semiconductor components, so do power and associated heat. In an example, a graphics processing unit (hereinafter "GPU") may require up to 500 W of power and thus require advanced cooling techniques.

SUMMARY

A multi-layer thermal interface material including two or more thermal interface materials laminated together, where each of the two or more thermal interface materials comprise different mechanical properties.

A structure including a heat sink mounted above a semiconductor component physically connected to a substrate and a multi-layer thermal interface material sandwiched between the heat sink and the semiconductor, one layer of the multi-layer thermal interface material comprises a first layer comprising a first thermal interface material laminated to a bottom surface of a second layer comprising a second thermal interface material.

A method including laminating a first layer comprising a first thermal interface material to a bottom surface of a second layer comprising a second thermal interface material, wherein the first thermal interface material of the first layer is more dimensionally compliant than the second thermal interface material of the second layer.

BRIEF DESCRIPTION OF THE DRAWINGS

The following detailed description, given by way of example and not intended to limit the invention solely thereto, will best be appreciated in conjunction with the accompanying drawings, in which.

Figure 1:
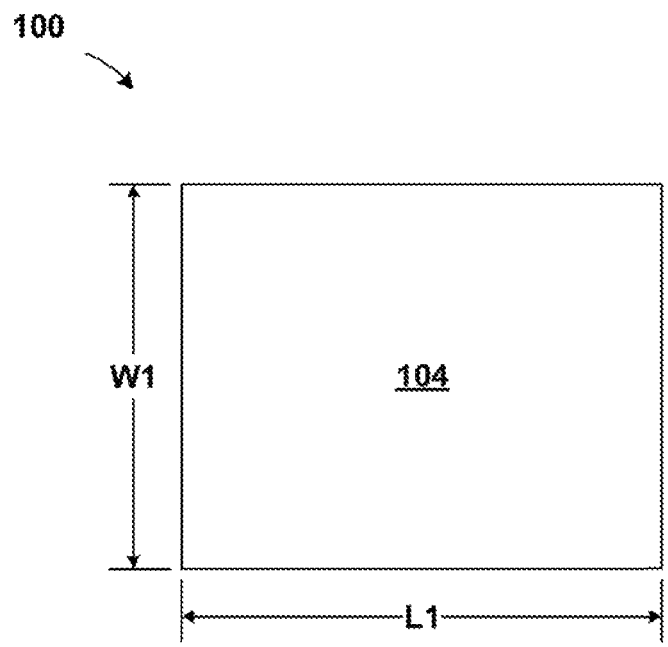
FIG. 1 is a top view of a multi-layer thermal interface material, according to an embodiment.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numbers may be repeated among the figures to indicate corresponding or analogous features.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Cooling requirements for semiconductors are increasing and high-performance semiconductors require increased cooling requirements when running at full performance. Semiconductor components can be cooled using a heat sink attached to a surface of the semiconductor component. Alternatively, the heat sink can be attached to a module lid of a semiconductor package. In such cases, the module lid of the semiconductor package covers and protects some combination of semiconductor components and discrete components. In other cases, water can be used to cool a semiconductor component or package via a network of water plumbed cold plates in place of a heat sink. For example, ambient operating temperatures for computers that specify ASHRAE® class A4 operating conditions range between 5 C and 40 C. ASHRAE is a registered trademark of the American Society of Heating, Refrigerating, and Air-Conditioning Engineers, Inc.

As mentioned above, the heat sink or other cooling device attaches to bare silicon semiconductor components. In such instances a thermal interface material is applied between the semiconductor component and the heat sink. The thermal interface material is used to improve thermal performance and maximize heat transfer from the semiconductor component to the heat sink. In other instances, the thermal interface material is applied between the module lid and the heat sink.

There are many commercially available types of thermal interface materials including metal heat spring thermal interface materials, polymeric elastomer materials, expanded graphite materials, carbon nanotube materials, flexible graphite spreader materials, thermal grease, thermal gel, among others. Additionally, in some embodiments, phase change materials can also be used as a thermal interface material.

Metal heat spring thermal interface materials can be made to preferentially release from a desired surface by adding a metal cladded aluminum foil, but require a high pressure in order to provide effective contact, minimize thermal resistance, and fill any interface gaps. Typically, some form of mechanical retention hardware is used to ensure adequate contact and optimal performance. Unfortunately, clamping forces of the mechanical retention hardware can damage the semiconductor component. The metal spring thermal interface materials also suffer from low elasticity, poor gap filling, and the potential for micro motion induced oxidation over time. Furthermore, the aluminum foil release layer can negatively affect thermal performance. Examples of metal spring thermal interface materials are available from Indium Corporation.

Polymeric elastomer materials may be used as a thermal interface material. The thermal properties of polymeric elastomer materials can be modified with the addition of various forms of carbon, for example graphene layers, graphite flake, carbon fibers, or carbon nanotubes. Polymeric elastomer materials offer both high thermal performance and reasonable gap filling capability to enable good contact between a semiconductor component and a heat sink. However, like the metal heat spring thermal interface materials, polymeric elastomer materials also require high pressures in order to adequately fill interface gaps. Also like the metal heat spring thermal interface materials, excess pressure can cause damage to the semiconductor component, for example, cracking. Polymeric elastomer materials adhesively bond to surface of both the semiconductor component and the heat sink. If future removal of the heat sink is required, the risk of damaging the semiconductor component or the thermal interface material is high due to the adhesive properties, for example the inherent tackiness, of polymeric elastomer materials. Although conventional release layers, such as, for example, non-stick polymers or aluminum foil, can be applied to polymeric elastomer materials, they create an insulative barrier and degrade thermal performance. Polymeric elastomer materials are manufactured by an array of suppliers including but not limited to, for example, Hitachi Chemical Co., Ltd., Zeon Chemicals L.P., and Dexerials Corp.

Expanded graphite materials may be used as a thermal interface material. Expanded graphite materials are available at relatively low cost, have good thermal performance and excellent dimensional compliance or gap filling capability, and release cleanly from device surfaces for easy reuse during semiconductor component repair or replacement. However, expanded graphite materials have limited elasticity and are not easily reusable for different surface topologies. Examples of expanded graphite materials include materials from Neograf Solutions, LLC.

Carbon nanotube materials may be used as a thermal interface material. Carbon nanotube materials include sheets of densely packed, generally vertically aligned and intertwined. Carbon nanotube materials offer extremely high thermal conductivity and thus excellent thermal performance. Carbon nanotube materials are durable and reusable, but have extremely limited elasticity and gap filling capabilities and require high mechanical loads to enable good thermal performance. Carbon nanotube materials are also relatively expensive to manufacture, and as such, are typically used as thermal beds on testers for lidded modules where high loads can be used without component damage and extremely high component test volumes are anticipated. Examples of carbon nanotube materials include materials from Carbice Corporation.

Flexible graphite materials may also be used for their superior heat transfer properties. Flexible graphite materials generally have poor gap filling capabilities. Examples of flexible graphite materials include, for example, Spreadershield™ from Neograf Solutions, LLC or Tgon™ 9000 series graphite spreader material from Laird plc.

Thermal grease or thermal gel may be used as TIM. Thermal grease or thermal gel is typically filled with various forms of thermally conductive media, such as, for example, carbon, metal particles, ceramic particles, or metal oxide particles. These materials have reasonable thermal performance and gap fill capability, but must be dispensed or printed onto surfaces. After being applied, thermal gel must be thermally cured as they rely on adhesive bonding at device and cooling hardware surfaces to ensure stable interface performance. Neither thermal grease nor thermal gel meets suitable reuse requirements.

Phase Change Material (hereinafter "PCM") may be used as a thermal interface material. PCM is a substance which can change from a solid to liquid at a certain temperature, for example, at room temperature. The PCM absorbs heat when changing from a solid to a liquid, and releases heat when changing from a liquid to a solid. Advantages of PCM when used in an embodiment of this invention include superior gap filling capability and good thermal performance.

The commercially available thermal interface materials described above, when used individually, cannot meet overall performance and assembly objectives for high performance semiconductors. High performance applications require optimal thermal and mechanical performance across a broad range of operating and storage temperatures. Additionally, there is a need to optimize thermal and mechanical performance while enabling reuse during semiconductor component repair or replacement.

The present invention generally relates to semiconductor packaging, and more particularly to thermal interface constructions, including thermal interface materials. Ideally, improving reusability while maintaining optimal thermal and mechanical performance of the thermal interface materials between a semiconductor component and a heat sink could reduce damage caused during repair or replacement and costs associated therewith. One way to improve reusability, maintain optimal thermal and mechanical performance, and reduce damage and associated costs may include using a multi-layer thermal interface material construction. Embodiments of the multi-layer thermal interface material construction are described in detail below by referring to the accompanying drawings FIGS. 1-15. The multi-layer thermal interface material construction solutions and affiliated processing methods described below address various known limitations of the thermal interface materials described above within the scope of semiconductor cooling requirements and other applications having similar requirements. In general, the multi-layer thermal interface material constructions described below are made with some combination of thermal interface materials in a variety of configurations.

Figure 2:
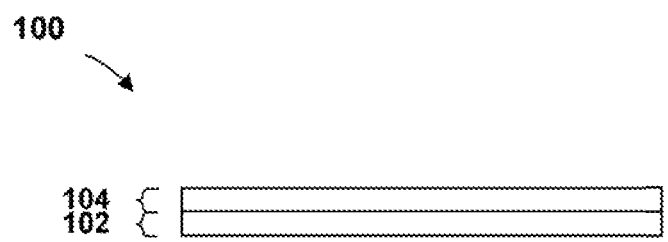
FIG. 2 is a side view of FIG. 1, according to an embodiment.

Referring now to FIGS. 1 and 2, a multi-layer thermal interface material 100 (hereinafter "multi-layer TIM 100") is shown, according to an exemplary embodiment. FIG. 1 is a top view of the multi-layer TIM 100, while FIG. 2 is a side view of FIG. 1. The multi-layer TIM 100 includes at least a first layer 102 and a second layer 104. The first layer 102 is designed to directly contact a semiconductor component (not shown) while the second layer 104 is designed to directly contact a heat sink or other cooling device (not shown). In practice, the multi-layer TIM 100 would replace a single layer TIM of a conventional assembly or semiconductor package. In general, the multi-layer TIM 100 has a length (L1) and a width (W1). According the present embodiment, the length (L1) and width (W1) of the first layer 102 is equal to the length (L1) and width (W1) of the second layer 104.

The first layer 102 and the second layer 104 may each include a material from any of several known thermal interface materials, including polymeric elastomer materials, expanded graphite materials, carbon nanotube materials, flexible graphite materials, and other materials, such as, phase change materials. The materials for each layer are chosen based on their individual thermal properties and mechanical properties, for example, gap filling capability, reuse properties, and inherent tackiness. The layers of the multi-layer TIM 100 are functionally graduated to optimize thermal and mechanical performance. In other words, various combinations of materials are selected to optimize, and balance, thermal and mechanical performance. For example, one layer of the multi-layer TIM 100 may be selected for its specific adhesion characteristics to enable easy device separation and reuse while another layer may be selected for its specific dimensional compliance. Overall performance of the multi-layer TIM 100 can be further optimized by adjusting the overall thickness of each material used to build the multi-layer TIM 100.

For example, a thicker layer may be used to offer additional dimensional compliance. A thicker readily deformable layer offers compliance for improved heat transfer, but increased thickness generally hurts thermal performance. However, a functionally graduated thermal interface, for example the multi-layer TIM 100, allows for improvements in heat transfer that either material alone could not achieve. This is particularly important for large multi-chip bare die GPU, or Field Programmable Gate Array (FPGA) packaging scenarios where device surfaces could exceed warpage of 200 microns.

In the embodiment shown, the multi-layer TIM 100 includes only two layers; however, any number of additional layers may be used in a variety of different combinations, as is described below. Depending on the combination of materials selected, the multi-layer TIM 100 offers potential for improved gap filling capability to ensure stable performance during power cycling, and component replacement operations, or both. The various layers of the multi-layer TIM 100 can be manufactured to their final shape and size, and then joined. Alternatively, the various layers of the multi-layer TIM 100 can be joined in sheet form and then cut to size using known sheering or blanking operations.

The layers of the multi-layer TIM 100 may be joined together using known joining or lamination techniques. Alternatively, a low pressure lamination operation may be used to bond layers of different materials together while preventing damage to any one layer of the multi-layer TIM 100. For example, a low pressure lamination process may be 50 PSI or less, at a temperature between 20 to 80 C. In an embodiment, plasma treatments can be used to promote layer to layer adhesion between the first layer 102 and the second layer 104. Plasma treatments include modifying the surfaces for improved acceptance of an additional layer. A plasma treatment is a reactive treatment to physically or chemically remove contaminants from adjoining surfaces of the first layer 102 and the second layer 104.

In an embodiment, silicone oil, hydrocarbon oil, thermal grease, thermal gel, or another material is placed between the first layer 102 and the second layer 104 to promote adhesion or to increase the thermal conductivity by removing trapped air pockets between the sheets. The oil is typically applied by coating the joining surfaces of one layer prior to joining.

In an embodiment, the first layer 102 includes a polymer elastomer material, and the second layer 104 includes an expanded graphite material. As previously stated, the polymer elastomer material and the expanded graphite material are chosen specifically for their thermal and mechanical properties. For example, the multi-layer TIM 100 may be used between a heat sink or other cooling device (not shown) and a first semiconductor component (not shown). Specifically, the adhesive characteristics of the polymer elastomer material of the first layer 102 allows adequate mechanical bonding of the multi-layer TIM 100 to the semiconductor component as well as the second layer 104. The thermal and mechanical properties of the polymer elastomer material are balanced with the properties of the expanded graphite material. Specifically, the expanded graphite material of the second layer 104 is a more dimensionally compliant material and provides better gap filling properties than the polymer elastomer material. As such, the expanded graphite material allows the multi-layer TIM 100 to accommodate movement caused by thermal cycling without compromising its thermal performance.

According to the present embodiment, the heat sink or other cooling device can be removed from the semiconductor component without damaging or compromising the multi-layer TIM 100 or worse damaging the underlying semiconductor component. This is particularly useful for testing applications requiring regular removal or replacement of the heat sink while keeping the multi-layer TIM 100 bonded with the semiconductor component. Unlike conventional single layered TIMs, the multi-layer TIM 100 substantially reduces the risk of damaging valuable semiconductor components during field servicing of equipment.

Alternatively, the first layer 102 and the second layer 104 can be flip-flopped (not shown). For example, the polymer elastomer material of the first layer 102 can be on top of the expanded graphite material of the second layer 104. In such cases, the expanded graphite material of the second layer 102 would contact the semiconductor component (not shown) and the heat sink (not shown) rests directly on the polymer elastomer material of the first layer 102. This alternative configuration has all the same properties, characteristics and advantages discussed above, except the heat sink and the multi-layer TIM 100 may be easily separated from the semiconductor component without damaging or compromising the multi-layer TIM 100 or worse damaging the underlying semiconductor component. For example, the multi-layer TIM 100 and the heat sink can be remounted to a different identical semiconductor component or a different semiconductor component having different dimensions, surface topology, or both. The expandable graphite material has excellent dimensional compliance thereby improving thermal performance of the assembly over single layered TIMs.

In some embodiments, the expanded graphite material of the second layer 104 is larger than the polymer elastomer material of the first layer 102, or vice versa. For example, the polymer elastomer material of the first layer 102 can be sized to match a footprint of the heat sink while the expanded graphite material of the second layer 104 can be sized to match a footprint of the semiconductor component, which may be larger or smaller than the heat sink.

In yet another embodiment, the multi-layer TIM 100 may include additional layers, for example three layers, one first layer 102 sandwiched between two second layers 104, or vice versa. For example, the multi-layer TIM 100 may include a layer of polymer elastomer material sandwiched between two layers of expanded graphite material. In such cases, the multi-layer TIM 100 would be fully releasable, and in essence reusable, from both the semiconductor component and the heat sink. In the alternative, for example, the multi-layer TIM 100 may include a layer of expanded graphite material sandwiched between two layers of polymer elastomer material. In such cases, the multi-layer TIM 100 would adequately adhere to both the semiconductor component and the heat sink, and would benefit from additional dimensional compliance from the expanded graphite material, despite not being releasable or reusable.

In yet another alternative, for example, the multi-layer TIM 100 may include a third layer of a flexible graphite material between the first layer 102 of polymer elastomer material and the second layer 104 of expanded graphite material. Such configurations would benefit from the advanced thermal performance of the flexible graphite material.

In yet another embodiment, the first layer 102 of the multi-layer TIM 100 includes a first polymer elastomer material, and the second layer 104 the multi-layer TIM 100 includes a second polymer elastomer material. In such cases, the first polymer elastomer material of the first layer 102 is preferably different from, and has different properties, than the second polymer elastomer material of the second layer 104.

It is appreciated by a person or ordinary skill in the art that the above embodiments are not intended to be limiting and that the multi-layer TIM 100 can include any number of layers of thermal interface materials in any configuration tailored to the specific cooling and reusability requirements of a particular assembly or semiconductor package.

Figure 3:
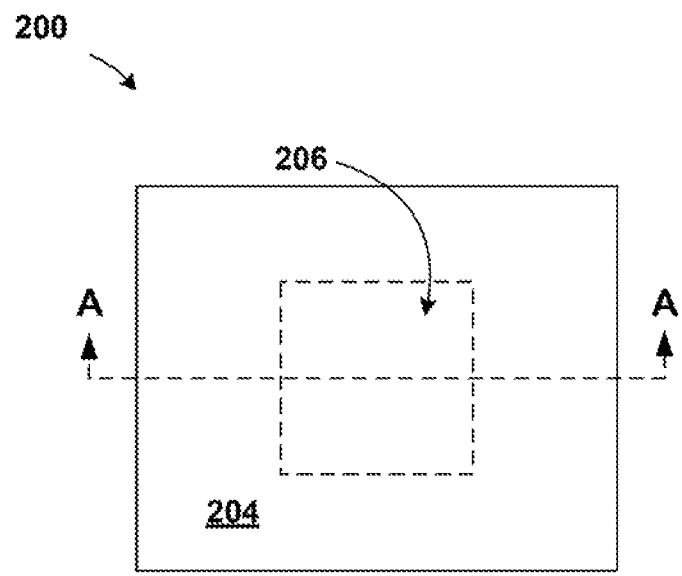
FIG. 3 is a top view of a multi-layer thermal interface material, according to an embodiment.
Figure 4:
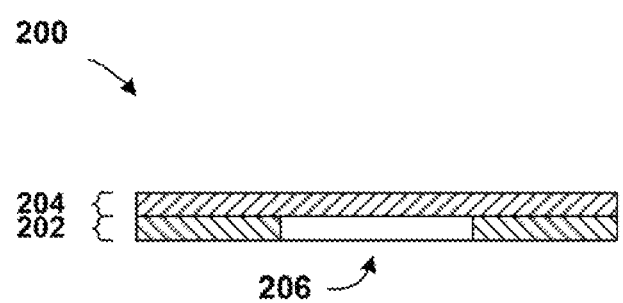
FIG. 4 is a cross section view of FIG. 3 taken along section line A-A, according to an embodiment.

Referring now to FIGS. 3 and 4, a multi-layer thermal interface material 200 (hereinafter "multi-layer TIM 200") is shown, according to an exemplary embodiment. FIG. 3 is a top view of the multi-layer TIM 200, while FIG. 4 is a cross section view of FIG. 4 taken along section line A-A. Similar to the multi-layer TIM described above, the multi-layer TIM 200 includes at least a first layer 202 and a second layer 204, but can include any number of layers. The first layer 202 and the second layer 204 may include any combination of thermal interface materials described above. Further, the first layer 202 and the second layer 204 can be joined using any known technique, such as, for example, the techniques describe above. The multi-layer TIM 200 is identical to the multi-layer TIM 100 described above, except as noted below. Moreover, the multi-layer TIM 200 may be used between a heat sink or other cooling device (not shown) and a semiconductor component (not shown), just like the other multi-layer thermal interface materials, for example, the multi-layer TIM 100.

Unlike the multi-layer TIM 100, the first layer 202 of the multi-layer TIM 200 has an opening 206, such that a portion of a bottom surface of the second layer 204 is exposed. Although, a single centered opening 206 is shown, in some embodiments, the first layer 202 may have two or more openings in any position or configuration. Like the multi-layer TIM 100 described above, the first layer 202 can be cut or stamped to its final shape, including the opening 206, prior to being joined with the second layer 204.

The openings or cutouts in the second layer 204, for example the opening 206, may be positioned to accommodate for various height components (not shown). In some cases, taller components may extend through the opening 206 and directly contact the second layer 204. In such embodiments, the first layer 202 may include a single opening 206 or multiple openings 206.

In addition to the material combinations described above with respect to the multi-layer TIM 100, the first layer 202 includes an expanded graphite material, and the second layer 204 includes a polymer elastomer material in accordance with an embodiment of the present invention. As previously stated, the polymer elastomer material and the expanded graphite material are chosen specifically for their thermal and mechanical properties. In such cases, the expanded graphite material of the first layer 202 directly contacts the semiconductor component (not shown) and the heat sink rests directly on the polymer elastomer material of the second layer 204. In addition to the superior thermal performance of the expanded graphite material, it is also releasable allowing the multi-layer TIM 200, and heat sink, to be subsequently removed without damaging or compromising the multi-layer TIM 200 or worse damaging the underlying semiconductor component.

Also, like the multi-layer TIM 100, the multi-layer TIM 200 may include additional layers. In some cases, oils or gels are added between the first layer 202 and the second layer 204 to promote adhesion and improve thermal conductivity. In other cases, additional layers of thermal interface materials can be added either below the first layer 202, between the first layer 202 and the second layer 204, or above the second layer 204.

Figure 5:
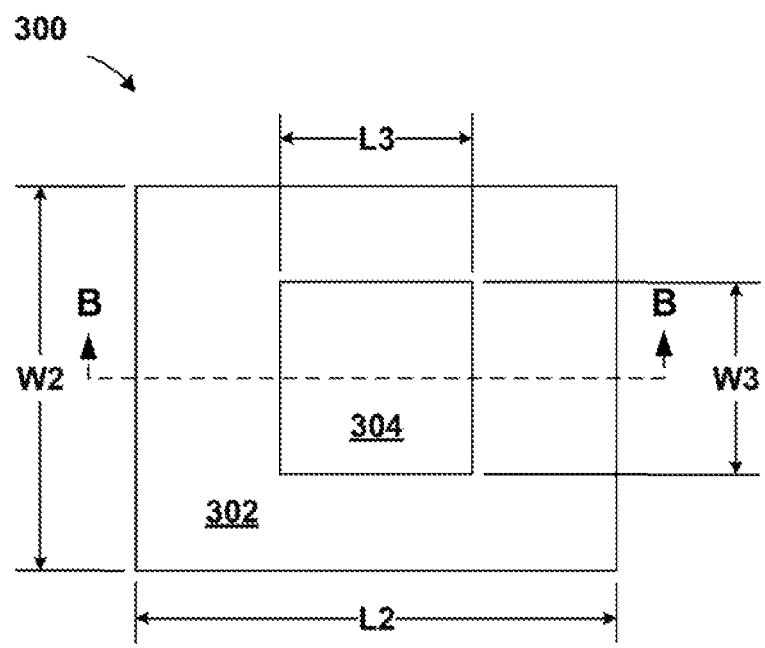
FIG. 5 is a top view of a multi-layer thermal interface material, according to an embodiment.
Figure 6:
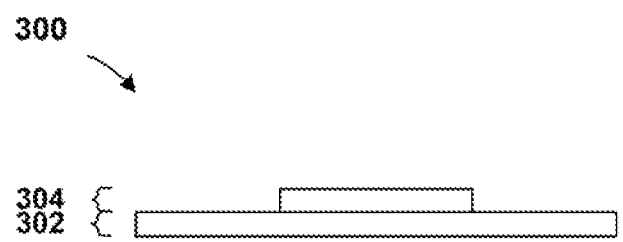
FIG. 6 is a cross section view of FIG. 5 taken along section line B-B, according to an embodiment.

Referring now to FIGS. 5 and 6, a multi-layer thermal interface material 300 (hereinafter "multi-layer TIM 300") is shown, according to an exemplary embodiment. FIG. 5 is a top view of the multi-layer TIM 300, while FIG. 6 is a cross section view of FIG. 5 taken along section line B-B. Similar to the multi-layer TIMs described above, the multi-layer TIM 300 includes at least a first layer 302 and a second layer 304, but can include any number of layers. The first layer 302 and the second layer 304 may include any combination of thermal interface materials described above. Further, the first layer 302 and the second layer 304 can be joined using any known technique, such as, for example, the techniques describe above. The multi-layer TIM 300 is identical to the multi-layer TIM 200 described above, except as noted below. Moreover, the multi-layer TIM 300 may be used between a heat sink or other cooling device (not shown) and a semiconductor component (not shown), just like the other multi-layer thermal interface materials, for example, the multi-layer TIM 100.

Unlike the multi-layer TIM 200, the first layer 302 does not have an opening or cutout and the first layer 302 is larger than the second layer 304. More specifically, a length (L2) and width (W2) of the first layer 302 are larger than a length (L3) and width (W3) of the second layer 304, as show in FIG. 5. Stated differently, the lateral dimensions of the first layer 302 are greater than lateral dimensions of the second layer 304. As such, the first layer 302 of the multi-layer TIM 200 has a larger surface area than the second layer 304. Like the multi-layer TIMs described above, the various layers of the multi-layer TIM 300 can be manufactured to their final shape and size, and then joined.

In addition to the material combinations of the multi-layer TIMs described above, the first layer 302 of the multi-layer TIM 300 includes a flexible graphite material, and the second layer 304 of the multi-layer TIM 300 includes a polymer elastomer material in accordance with an embodiment of the present invention. As previously stated, the polymer elastomer material and the flexible graphite material are chosen specifically for their thermal and mechanical properties. In such cases, the flexible graphite material of the first layer 302 directly contacts the semiconductor component (not shown) and the heat sink rests directly on the polymer elastomer material of the second layer 304. In addition to the superior thermal performance of the flexible graphite material, it is also releasable allowing the multi-layer TIM 300, and heat sink, to be subsequently removed without damaging or compromising the multi-layer TIM 300 or worse damaging the underlying semiconductor component.

In accordance with the present embodiment, the flexible graphite material of the first layer 302 can be sized to match a footprint of the semiconductor component while the polymer elastomer material of the second layer 304 can be sized to match a footprint of the heat sink, which may be larger or smaller than the semiconductor component. Alternatively, the flexible graphite material of the first layer 302 can be larger than, and extend beyond a perimeter of the semiconductor component. Doing so improves cooling by taking advantage of the advanced thermal performance of the flexible graphite material. Improved cooling is achieved through portions of the flexible graphite material of the first layer 302, specifically upper and lower surfaces, being exposed to air. In some embodiments, portions of the flexible graphite material of the first layer 302 extending beyond a perimeter of the semiconductor component contact and improve cooling of other semiconductor components. Tailoring the size of each layer of the multi-layer TIM 300 also lowers material costs and reduces waste.

Also, like the multi-layer TIM 100, the multi-layer TIM 300 may include additional layers. In some cases, oils or gels are added between the first layer 302 and the second layer 304 to promote adhesion and improve thermal conductivity. In other cases, additional layers of thermal interface materials can be added either below the first layer 302, between the first layer 302 and the second layer 304, or above the second layer 304. For example, a layer of expandable graphite material or polymer elastomer material can be added beneath the first layer 302 and sized to match a footprint of the semiconductor component. The additional layer of expandable graphite material can be equal to, smaller or larger than the first layer 302, the second layer 304, or both.

Figure 7:
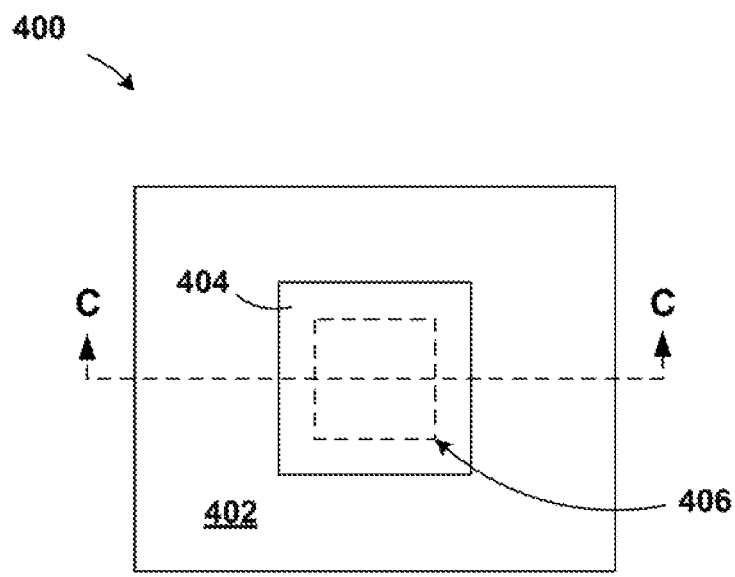
FIG. 7 is a top view of a multi-layer thermal interface material, according to an embodiment.
Figure 8:
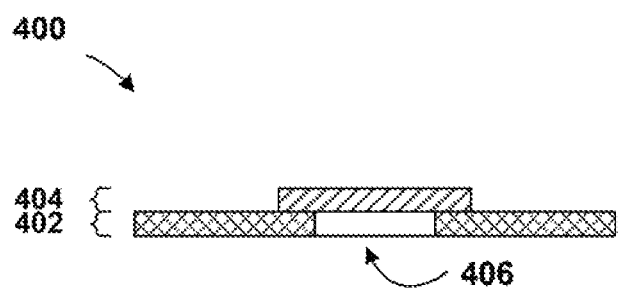
FIG. 8 is a cross section view of FIG. 7 taken along section line C-C, according to an embodiment.

Referring now to FIGS. 7 and 8, a multi-layer thermal interface material 400 (hereinafter "multi-layer TIM 400") is shown, according to an exemplary embodiment. FIG. 7 is a top view of the multi-layer TIM 400, while FIG. 8 is a cross section view of FIG. 7 taken along section line C-C. Similar to the multi-layer TIMs described above, the multi-layer TIM 400 includes at least a first layer 402 and a second layer 404, but can include any number of layers. The first layer 402 and the second layer 404 may include any combination of thermal interface materials described above. Further, the first layer 402 and the second layer 404 can be joined using any known technique, such as, for example, the techniques describe above. The multi-layer TIM 400 is identical to the multi-layer TIM 300 described above, except as noted below. Moreover, the multi-layer TIM 400 may be used between a heat sink or other cooling device (not shown) and a semiconductor component (not shown), just like the other multi-layer thermal interface materials, for example, the multi-layer TIM 100.

Unlike the multi-layer TIM 300, the first layer 402 of the multi-layer TIM 400 has an opening 406, such that a portion of a bottom surface of the second layer 404 in the center of the multi-layer TIM 400 is exposed. Although, a single centered opening 406 is shown, in some embodiments, the first layer 402 may have two or more openings in any position or configuration. Like the multi-layer TIMs described above, the various layers of the multi-layer TIM 400 can be manufactured to their final shape and size, and then subsequently joined.

Like the multi-layer TIM 200, the openings or cutouts in the first layer 402, for example the opening 406, may be positioned to accommodate for various height components (not shown). In some cases, taller components may extend through the opening 406 and directly contact the second layer 404. In such embodiments, the first layer 402 may include a single opening 406 or multiple openings 406.

In addition to the material combinations of the multi-layer TIMs described above, the first layer 402 includes a flexible graphite material, and the second layer 404 includes a polymer elastomer material in accordance with an embodiment of the present invention. As previously stated, the polymer elastomer material and the flexible graphite material are chosen specifically for their thermal and mechanical properties. In such cases, the flexible graphite material of the first layer 402 directly contacts the semiconductor component (not shown) and the heat sink rests directly on the polymer elastomer material of the second layer 404. In addition to the superior thermal performance of the flexible graphite material, it is also releasable allowing the multi-layer TIM 400, and heat sink, to be subsequently removed without damaging or compromising the multi-layer TIM 400 or worse damaging the underlying semiconductor component.

Also, like the multi-layer TIM 300, the multi-layer TIM 400 may include additional layers. In some cases, oils or gels are added between the first layer 402 and the second layer 404 to promote adhesion and improve thermal conductivity. In other cases, additional layers of thermal interface materials can be added either below the first layer 402, between the first layer 402 and the second layer 404, or above the second layer 404. For example, a layer of expandable graphite material or polymer elastomer material can be added beneath the first layer 402 and sized to match a footprint of the semiconductor component. In such cases, the additional layer of expandable graphite material will have an opening or cutout matching the opening 406 in the first layer 402.

Figure 9:
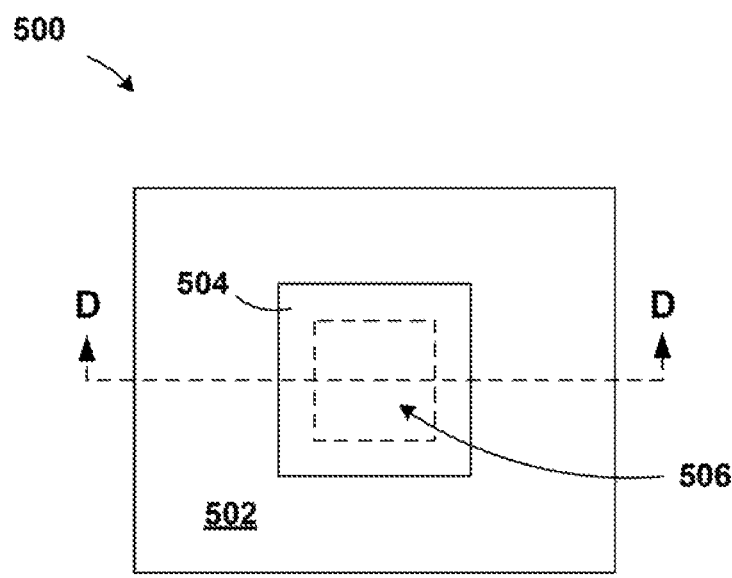
FIG. 9 is a top view of a multi-layer thermal interface material, according to an embodiment.
Figure 10:
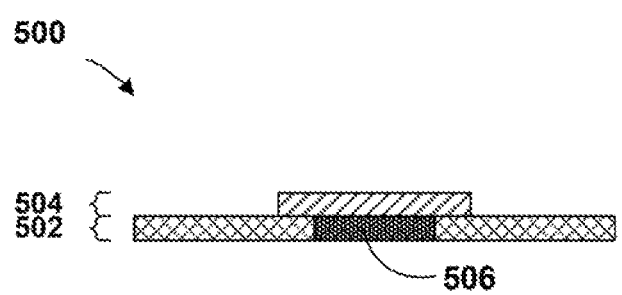
FIG. 10 is a cross section view of FIG. 9 taken along section line D-D, according to an embodiment.

Referring now to FIGS. 9 and 10, a multi-layer thermal interface material 500 (hereinafter "multi-layer TIM 500") is shown, according to an exemplary embodiment. FIG. 9 is a top view of the multi-layer TIM 500, while FIG. 10 is a cross section view of FIG. 9 taken along section line D-D. Similar to the multi-layer TIMs described above, the multi-layer TIM 500 includes at least a first layer 502 and a second layer 504, but can include any number of layers. The first layer 502 and the second layer 504 may include any combination of thermal interface materials described above. Further, the first layer 502 and the second layer 504 can be joined using any known technique, such as, for example, the techniques describe above. The multi-layer TIM 500 is identical to the multi-layer TIM 400 described above, except as noted below. Moreover, the multi-layer TIM 500 may be used between a heat sink or other cooling device (not shown) and a semiconductor component (not shown), just like the other multi-layer thermal interface materials, for example, the multi-layer TIM 100.

Unlike the multi-layer TIM 400, an opening in the first layer 502 is filled with a plug 506. The plug 506 is made from a different thermal interface material than the first layer 502. In some embodiments, the plug 506 can be made from the same material as the second layer 504, or a different material. In an embodiment, the first layer 502 is made of flexible graphite material, the second layer 504 is made from a polymer elastomer material, and the plug 506 is made from expandable graphite material. In such cases, the expandable graphite material of the plug 506 allows for dimensional compliance, the flexible graphite material of the first layer 502 provides advanced cooling performance, and the polymer elastomer material of the second layer 504 provides requisite adhesive properties. According to an alternative embodiment, the first layer 502 is made of flexible graphite material, and both the second layer 504 and the plug 506 are made from a polymer elastomer material. Like the multi-layer TIMs described above, the various layers of the multi-layer TIM 500 can be manufactured to their final shape and size, and then joined.

In such cases, the polymer elastomer material of the plug 506 and the second layer 504 can be appropriately sized to match a corresponding semiconductor component and heat sink while the flexible graphite material of the first layer 502 provides advanced cooling performance. In some cases, the plug 506 can be smaller than the second layer 504, as shown in FIGS. 9 and 10. In other cases the plug 506 can be equal size or larger than the second layer 504. For example, the first layer 102 can be sized to match a footprint of the heat sink while the plug 506 can be sized to match a footprint of the semiconductor component, which may be larger or smaller than the heat sink.

Also, like the multi-layer TIM 400, the multi-layer TIM 500 may include additional layers. In some cases, oils or gels are added between the first layer 502 and the second layer 504 to promote adhesion and improve thermal conductivity. In other cases, additional layers of thermal interface materials can be added either below the first layer 502, between the first layer 502 and the second layer 504, or above the second layer 504. For example, a layer of expandable graphite material or polymer elastomer material can be added beneath the first layer 502 and sized to match a footprint of the semiconductor component. In such cases, the additional layer and the polymer elastomer material of the second layer 504 can each be size to match respective components while the polymer elastomer material of the plug 506 maintains a path for thermal conduction.

Figure 11:
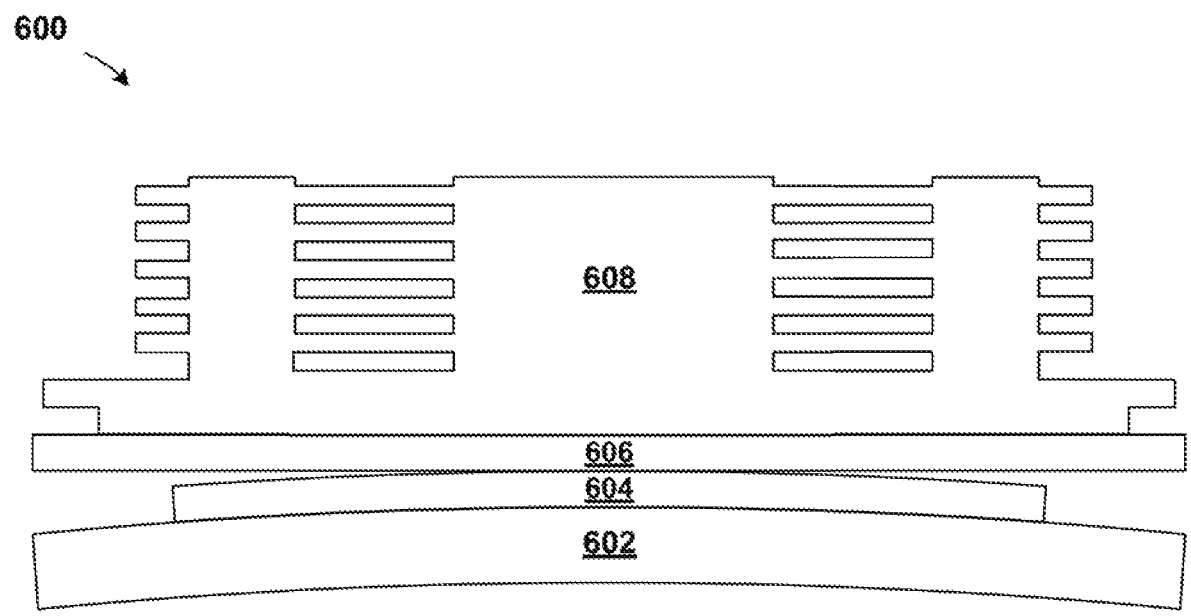
FIG. 11 is a cross section view of a structure assembled with a single-layer thermal interface material, according to an embodiment.

Referring now to FIG. 11, a structure 600 assembled with a single-layer thermal interface material is shown after/during operation and thermal cycling. The structure 600 includes a substrate 602, a semiconductor component 604, a single-layer thermal interface material 606, and a heat sink 608. FIG. 11 illustrates problems encountered when using a single-layer thermal interface material.

The substrate 602, also known as a carrier, may be a ceramic substrate, a composite substrate, a laminate substrate, or a printed circuit board. In an embodiment, the substrate 602 is an organic laminate substrate. Laminate substrates may be very similar to printed circuit boards in that similar materials and build processes are used; however, laminate substrates may have significantly higher per-layer wiring densities. Laminate substrates may be preferable for their relatively lower cost and increased electrical performance due to the use of copper conductors and lower-dielectric-constant insulator materials. For example, the substrate 602 may include four epoxy-glass-reinforced copper layers jacketed by four unreinforced build-up dielectric layers on each side. In many cases, the copper layers of the substrate 602 will include one or more thick full metal layers referred to as power planes and thinner sub-planes referred to as power islands.

The semiconductor component 604 may also be referred to as a chip, a die, a die stack, an integrated circuit, an electronic component, a component, an electronic device, a semiconductor device, or a device, among other references. The semiconductor component 604 may include a logic chip, a voltage reference device, a digital signal processor, a microprocessor, a microcontroller, a graphics processor, a memory device, a memory cube, a booting device, a radio frequency device, a high band width memory device, or any other semiconductor device. Typically, the semiconductor component 604 is electrically and physically connected to an upper surface of the substrate 602 using a plurality of solder connections, according to known techniques. The semiconductor component 604 is generally smaller than the substrate 602 to which it is attached. For example, in an embodiment, the semiconductor component 604 may be approximately 75 mm×100 mm, and the substrate 602 may be approximately 500 mm×1000 mm.

In an embodiment, there may be multiple components covered by the single-layer TIM 606 and the heat sink 608, including additional semiconductor components 604, discrete components, such as capacitors, resistors, transistors, diodes, or other devices.

Preferably, the single-layer TIM 606 maintains direct contact between the semiconductor component 604 and the heat sink 608. More specifically, the single-layer TIM 606 maintains thermal contact between the semiconductor component 604 and the heat sink 608 in order to maximize heat transfer away from the semiconductor component 604. If the thermal contact between the semiconductor component 604 and the heat sink 608 is compromised, the semiconductor component 604 may suffer from inadequate cooling.

As contact is decreased between the single-layer TIM 606 and the heat sink 608, efficiency and cooling of the semiconductor component 604 is decreased. Preferably, the single-layer TIM 606 would remain uncompromised and maintain adequate thermal contact between the semiconductor component 604 and the heat sink 608. Adequate thermal contact between the semiconductor component 604 and the heat sink 608 may preferably include uninterrupted contact between the semiconductor component 604 and the single-layer TIM 606 and uninterrupted contact between the single-layer TIM 606 and the heat sink 608. Unfortunately, thermal cycling and coefficient of thermal expansion mismatch, among other things, can compromise contact between the semiconductor component 604 and the single-layer TIM 606, and between the single-layer TIM 606 the heat sink 608. Additionally, manufacturing or assembly defects may also compromise contact between the semiconductor component 604 and the single-layer TIM 606, and between the single-layer TIM 606 the heat sink 608.

For purposes of the present disclosure, the thermal cycling and compromised contact is illustrated by exaggerated warping or curvature of the substrate 602 and the semiconductor component 604. As illustrated, the single-layer TIM 606 does not maintain adequate contact with the semiconductor component 604. It is noted that the exaggerated warping or curvature of the substrate 602 and the semiconductor component 604 is presented for illustrative purposes only, and is not intended to limit the mode in which the single-layer TIM 606 can be compromised due to thermal cycling.

Figure 12:
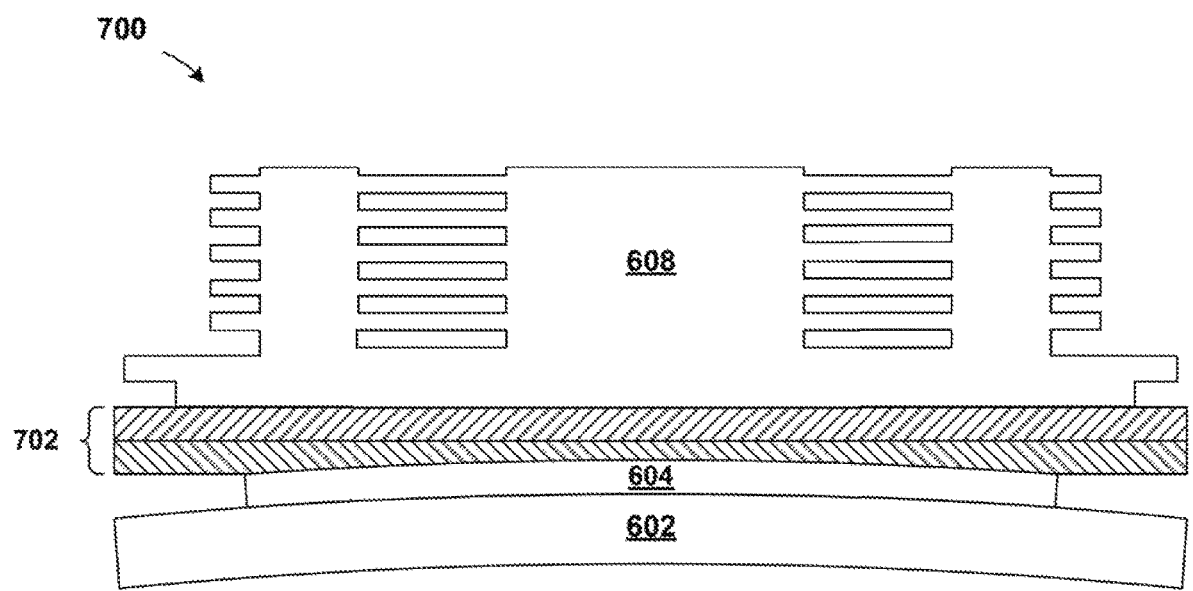
FIG. 12 is a cross section view of a structure assembled with a multi-layer thermal interface material, according to an embodiment.

Referring now to FIG. 12, a structure 700 assembled with a multi-layer thermal interface material is shown after/during operation and thermal cycling. The structure 700 includes the substrate 602, the semiconductor component 604, a multi-layer thermal interface material 702 (hereinafter "multi-layer TIM 702"), and the heat sink 608. FIG. 12 illustrates advantages and benefits of using a multi-layered thermal interface material as disclosed and described above. The multi-layer TIM 702 of the structure 700 represents any one of the multi-layered thermal interface materials described above with respect to FIGS. 1-10.

As illustrated, the multi-layer TIM 702 outperforms the single-layer TIM 606. More specifically, the multi-layer TIM 702, because of the tailored properties of each layer, conforms to variations in the surface of the semiconductor component 604. For example, the lower layer of the multi-layer TIM 702, made from, for example, polymeric elastomer materials or expandable graphite materials (as detailed above), is more dimensionally compliant and provides improved gap filling properties. Additionally, the lower layer of the multi-layer TIM 702 accommodates movement caused by thermal cycling without compromising the thermal performance of the TIM 702. As such, the multi-layer TIM 702 remains uncompromised and maintains adequate thermal contact between the semiconductor component 604 and the heat sink 608. Alternatively, the improved dimensional compliance of the multi-layer TIM 702 can be realized in the upper layer. For example, the upper layer of the multi-layer TIM 702, can be made from, for example, polymeric elastomer materials or expandable graphite materials (as detailed above) and provide additional dimensional compliance.

Figure 13:
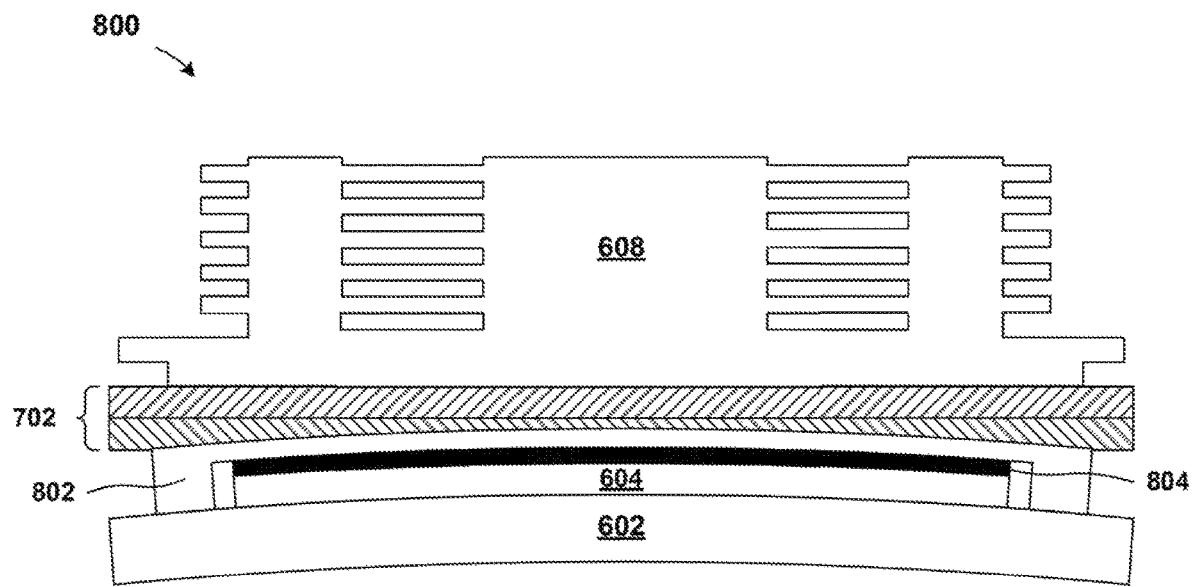
FIG. 13 is a cross section view of a structure assembled with a multi-layer thermal interface material, according to an embodiment.

Referring now to FIG. 13, a structure 800 assembled with a multi-layer thermal interface material is shown after/during operation and thermal cycling. The structure 800 includes the substrate 602, the semiconductor component 604, the multi-layer thermal interface material 702, the heat sink 608, as well as a lid 802 and single layer thermal interface material 804. Like FIG. 12, FIG. 13 illustrates advantages and benefits of using a multi-layered thermal interface material as disclosed and described above. The multi-layer TIM 702 of the structure 700 and 800 represents any one of the multi-layered thermal interface materials described above with respect to FIGS. 1-10.

As illustrated, the multi-layer TIM 702 can be used between the lid 802 and the heat sink 608 according to an embodiment of the present invention. As previously described, the multi-layer TIM 702 remains uncompromised and maintains adequate thermal contact between the lid 802 and the heat sink 608.

Figure 14:
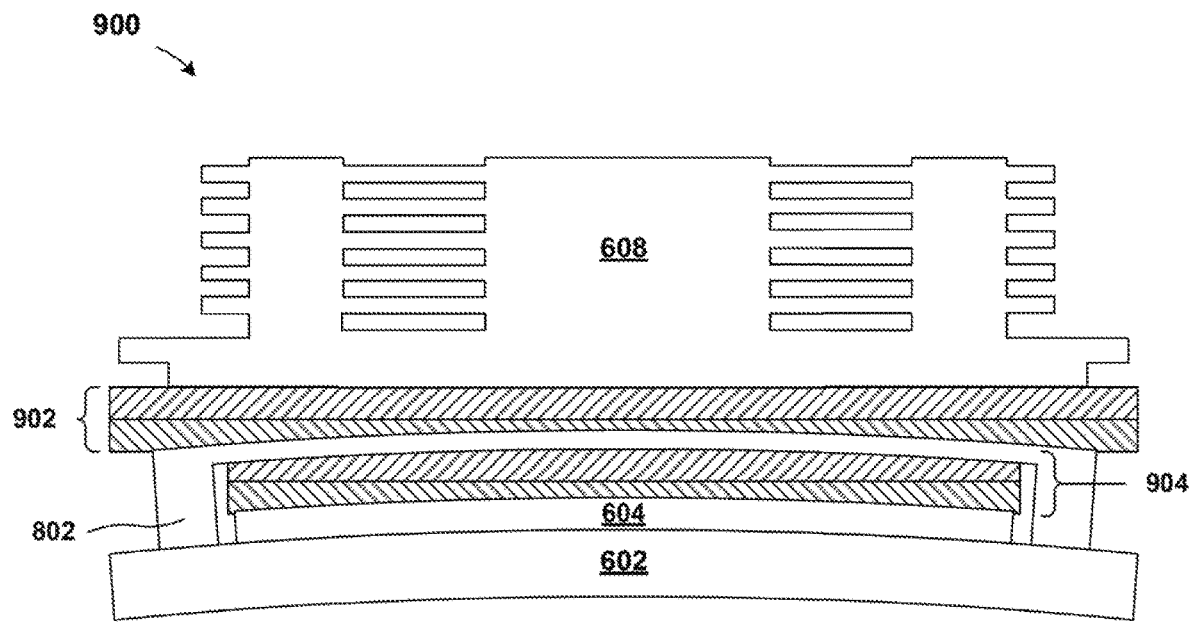
FIG. 14 is a cross section view of a structure assembled with a multi-layer thermal interface material, according to an embodiment.

Referring now to FIG. 14, a structure 900 assembled with two multi-layer thermal interface materials is shown after/during operation and thermal cycling. The structure 900 includes the substrate 602, the semiconductor component 604, a first multi-layer thermal interface material 902 (hereinafter "first multi-layer TIM 902"), a second multi-layer thermal interface material 904 (hereinafter "second multi-layer TIM 904"), the heat sink 608, and the lid 802. Like FIG. 13, FIG. 14 illustrates advantages and benefits of using multi-layered thermal interface materials as disclosed and described above. The first multi-layer TIM 902 and the second multi-layer TIM 904 of the structure 900 each represent any one of the multi-layered thermal interface materials described above with respect to FIGS. 1-10.

As illustrated, the first multi-layer TIM 902 is placed between the lid 802 and the heat sink 608, and the second multi-layer TIM 904 is positioned between the semiconductor component 604 and the lid 802 according to an embodiment of the present invention. As previously described, both the first multi-layer TIM 902 and the second multi-layer TIM 904 remain uncompromised and maintain adequate thermal contact between the semiconductor component 604, the lid 802, and the heat sink 608. Using the second multi-layer TIM 904 positioned between the semiconductor component 604 and the lid 802 provide unique advantages when the semiconductor component 604 includes multiple heights or surface variations, or when additional discrete components (not shown) with varying heights are mounted to the substrate 602 adjacent to the semiconductor component 604. In such cases, the second multi-layer TIM 904 can accommodate for the various heights and maintain adequate thermal contact between the semiconductor component 604, additional discrete components, the lid 802, and the heat sink 608.

Figure 15:
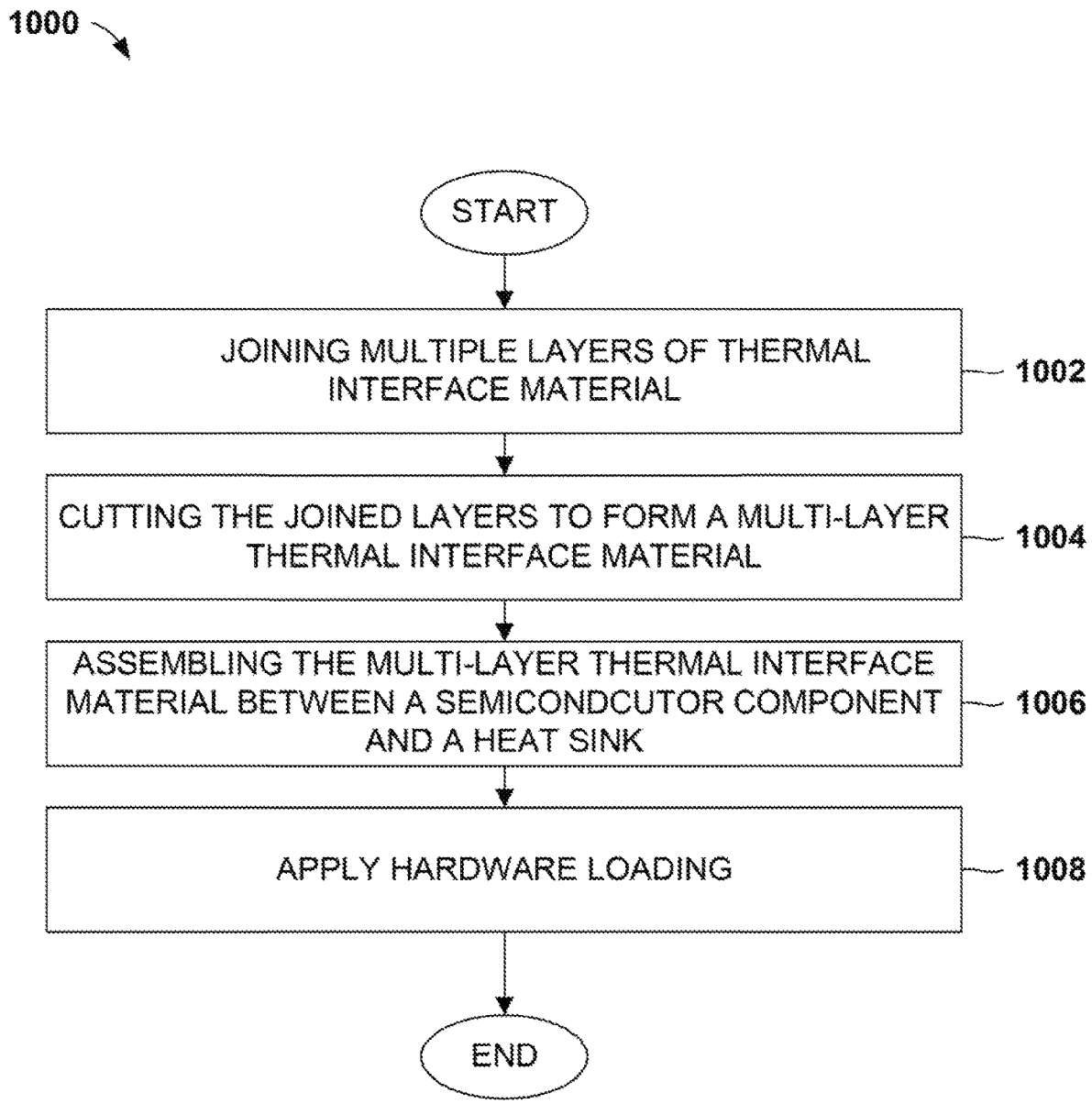
FIG. 15 is an operational flowchart illustrating a method of making the multi-layered thermal interface materials, according to an embodiment.

Referring now to FIG. 15, an operational flowchart illustrating a method 1000 of making the multi-layered thermal interface materials described above is shown, according to an embodiment.

At 1002, two or more individual layers of thermal interface material are joined or laminated together. At 1004, the joined layers are then cut to size to form the multi-layer thermal interface material described in detail above. Alternatively, the individual layers of thermal interface material are cut to size and then subsequently joined or laminated together. At 1006, the multi-layer thermal interface material is then assembled between a semiconductor component and a heat sink. In some cases, as described above, the multi-layer thermal interface material is assembled between a lid and a heat sink. At 1008, hardware loading is applied to the assembly. The hardware loading includes a applying a downward pressure on the assembly such that the multi-layer thermal interface material maintains adequate contact with the semiconductor component. More specifically, the downward pressure from hardware loading causes the flexible and expandable layer(s) of the multi-layer thermal interface material to comply with various surface topologies and thus maximize physical contact with the semiconductor component, thereby improving cooling performance. It is noted that lower hardware loading pressures can be used to maintain adequate contact when using the multi-layer thermal interface materials as compared to higher loading pressures when using conventional single layer thermal interface materials.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A multi-layer thermal interface material comprising:
two or more thermal interface materials laminated together, wherein each of the two or more thermal interface materials comprise different mechanical properties,
wherein the two or more thermal interface materials of the multi-layer thermal interface material are each selected from a group consisting of polymeric elastomer materials, expanded graphite materials, carbon nanotube materials, flexible graphite materials and phase change materials.

2. The multi-layer thermal interface material according to claim 1, further comprising:
an adhesion layer between the two or more thermal interface materials of the multi-layer thermal interface material, wherein the adhesion layer comprises silicone oil, hydrocarbon oil, thermal grease, or thermal gel.

3. The multi-layer thermal interface material according to claim 1, wherein one of the thermal interface materials comprises phase change material.

4. The multi-layer thermal interface material according to claim 1, wherein one of the two or more thermal interface materials has a larger surface area than another one of the two or more thermal interface materials.

5. The multi-layer thermal interface material according to claim 1, further comprising:
an opening in one of the two or more thermal interface materials.

6. A structure comprising:
a heat sink mounted above a semiconductor component and physically connected to a substrate; and
a multi-layer thermal interface material sandwiched between the heat sink and the semiconductor component, one layer of the multi-layer thermal interface material comprises a first layer comprising a first thermal interface material laminated to a bottom surface of a second layer comprising a second thermal interface material, wherein the first layer comprises an expanded graphite material and the second layer comprises a polymer elastomer material.

7. The structure according to claim 6, further comprising:
an adhesion layer between the first layer and the second layer, wherein the adhesion layer comprises silicone oil, hydrocarbon oil, thermal grease, or thermal gel.

8. The structure according to claim 6, wherein lateral dimensions of the first layer are greater than lateral dimensions of the second layer.

9. The structure according to claim 6, further comprising:
an opening in the first layer.

10. A multi-layer thermal interface material comprising:
two or more thermal interface materials laminated together, wherein each of the two or more thermal interface materials comprise different mechanical properties,
wherein one of the thermal interface materials comprises an expanded graphite material and another thermal interface material comprises a polymer elastomer material.

11. The multi-layer thermal interface material according to claim 10, further comprising:
an adhesion layer between the two or more thermal interface materials of the multi-layer thermal interface material, wherein the adhesion layer comprises silicone oil, hydrocarbon oil, thermal grease, or thermal gel.

12. The multi-layer thermal interface material according to claim 10, wherein one of the two or more thermal interface materials has a larger surface area than another one of the two or more thermal interface materials.

13. The structure according to claim 10, further comprising:
an opening in one of the two or more thermal interface materials.

14. A multi-layer thermal interface material comprising:
two or more thermal interface materials laminated together, wherein each of the two or more thermal interface materials comprise different mechanical properties,
wherein one of the thermal interface materials comprises a flexible graphite material and another thermal interface material comprises a polymer elastomer material.

15. The multi-layer thermal interface material according to claim 14, further comprising:
an adhesion layer between the two or more thermal interface materials of the multi-layer thermal interface material, wherein the adhesion layer comprises silicone oil, hydrocarbon oil, thermal grease, or thermal gel.

16. The multi-layer thermal interface material according to claim 14, wherein one of the two or more thermal interface materials has a larger surface area than another one of the two or more thermal interface materials.

17. The structure according to claim 14, further comprising:
an opening in one of the two or more thermal interface materials.

18. A structure comprising:
a heat sink mounted above a semiconductor component and physically connected to a substrate; and
a multi-layer thermal interface material sandwiched between the heat sink and the semiconductor component, one layer of the multi-layer thermal interface material comprises a first layer comprising a first thermal interface material laminated to a bottom surface of a second layer comprising a second thermal interface material, wherein the first layer comprises a flexible graphite material and the second layer comprises a polymer elastomer material.

19. The multi-layer thermal interface material according to claim 18, further comprising:
an adhesion layer between the first layer and the second layer, wherein the adhesion layer comprises silicone oil, hydrocarbon oil, thermal grease, or thermal gel.

20. The multi-layer thermal interface material according to claim 18, wherein lateral dimensions of the first layer are greater than lateral dimensions of the second layer.

21. The structure according to claim 18, further comprising:

an opening in the first layer.

* * * * *